United States Patent [19]

Willett et al.

[11] Patent Number: 5,399,637
[45] Date of Patent: Mar. 21, 1995

[54] ENERGY-POLYMERIZABLE ADHESIVE, COATING, AND FILM

[75] Inventors: Peggy S. Willett, Stillwater; Janis Robins, St. Paul; Kent S. Tarbutton, Lake Elmo; Michael A. Kropp, Cottage Grove, all of Minn.

[73] Assignee: Minnesota Mining and Manufacturing Company, St. Paul, Minn.

[21] Appl. No.: 99,182

[22] Filed: Jul. 29, 1993

Related U.S. Application Data

[62] Division of Ser. No. 823,819, Jan. 22, 1992, Pat. No. 5,252,894.

[51] Int. Cl.$^6$ ............ C08F 4/26; C08F 226/06; C08F 224/00; C08F 230/08; C08F 226/02; C08F 210/00; C08F 216/12
[52] U.S. Cl. ............ 526/142; 526/273; 526/266; 526/332; 526/279; 526/310; 526/348; 526/264
[58] Field of Search ............ 526/142, 264, 266, 273, 526/279, 310, 332, 348

[56] References Cited

U.S. PATENT DOCUMENTS

| | | | |
|---|---|---|---|
| 3,723,392 | 3/1973 | Konig et al. | 260/75 |
| 3,907,706 | 9/1975 | Robins | 252/431 |
| 4,069,054 | 1/1978 | Smith | 96/115 |
| 4,156,035 | 5/1979 | Tsao et al. | 427/44 |
| 4,223,067 | 9/1980 | Levens | 428/308 |
| 4,227,978 | 10/1980 | Barton | 204/159.12 |
| 4,231,951 | 11/1980 | Smith et al. | 260/446 |
| 4,247,653 | 1/1981 | Wagner | 521/158 |
| 4,250,203 | 2/1981 | Schlesinger et al. | 427/44 |
| 4,305,920 | 12/1981 | Hasuo et al. | 526/142 |
| 4,318,791 | 3/1982 | Felder et al. | 204/159.23 |
| 4,326,086 | 4/1982 | Mehring | 568/388 |
| 4,341,909 | 7/1982 | Schneider et al. | 568/863 |
| 4,379,862 | 4/1983 | Wagner | 521/158 |
| 4,428,807 | 1/1984 | Lee et al. | 204/159.14 |
| 4,606,962 | 8/1986 | Reylek et al. | 428/148 |
| 4,623,676 | 11/1986 | Kistner | 522/15 |
| 4,642,126 | 2/1987 | Zador et al. | 51/295 |
| 4,652,274 | 3/1987 | Boettcher et al. | 51/298 |
| 4,657,779 | 4/1987 | Gaske | 427/54.1 |
| 4,677,137 | 6/1987 | Bany et al. | 522/31 |
| 4,694,029 | 9/1987 | Land | 522/8 |

(List continued on next page.)

FOREIGN PATENT DOCUMENTS

| | | | |
|---|---|---|---|
| 8538551 | 8/1985 | Australia | . |
| 0340591A2 | 11/1989 | European Pat. Off. | . |
| 0393407A1 | 10/1990 | European Pat. Off. | C09I 163/00 |

(List continued on next page.)

OTHER PUBLICATIONS

Odian *Principles of Polymerization* pp. 253–259 (3d ed. 1991).
Karabatos *J. Org. Chem.* 30, 689 (1965).
Cox, Jr., *J. Am. Chem. Soc'y* 80, 5441 (1958).
Goldwhite *J. Am. Chem. Soc'y* 79, 2409 (1957).
"Principles of Polymerization", Third Edition, George Odian, John Wiley & Sons, Inc., pp. 536–539 (1991).
Saunders *High Polymers, vol. XVI,* "Polyurethanes, Chemistry and Technology," vol. I, pp. 32–42, 44–45 and vol. II, pp. 5–6, 198–199 (1962, 1964).

(List continued on next page.)

*Primary Examiner*—Joseph L. Schofer
*Assistant Examiner*—Wu C. Cheng
*Attorney, Agent, or Firm*—Gary L. Griswold; Walter N. Kirn; Carolyn V. Peters

[57] ABSTRACT

Polymerizable compositions having at least one cationically polymerizable monomer; an optional free radically polymerizable monomer; an energy-polymerizable catalyst system wherein the catalyst system comprises an organometallic complex salt; a thermally decomposable ester reaction product of a tertiary alkyl alcohol and an acid that forms a chelation complex with the metal ion of the organometallic complex salt; optionally, a peroxide. The polymerized compositions are useful as cured adhesive films, pressure sensitive adhesives, protective coatings, liquid adhesives, structural and semi-structural adhesives, and free standing films.

8 Claims, No Drawings

U.S. PATENT DOCUMENTS

| | | | |
|---|---|---|---|
| 4,707,432 | 11/1987 | Gatechair et al. | 430/281 |
| 4,717,605 | 1/1988 | Urban et al. | 428/1 |
| 4,751,138 | 6/1988 | Tumey et al. | 428/323 |
| 4,846,905 | 7/1989 | Tarbutton et al. | 525/65 |
| 4,849,320 | 7/1989 | Irving et al. | 430/280 |
| 4,950,696 | 8/1990 | Palazzotto et al. | 522/25 |
| 4,985,340 | 1/1991 | Palazzotto et al. | 430/270 |
| 5,043,102 | 8/1991 | Chen et al. | 252/514 |
| 5,059,701 | 10/1991 | Keipert | 556/13 |

FOREIGN PATENT DOCUMENTS

| | | |
|---|---|---|
| 109851 | 6/1994 | European Pat. Off. . |
| 2706297 | 8/1978 | Germany . |
| 2714084 | 10/1978 | Germany . |
| 4627807 | 8/1971 | Japan . |
| 1495746 | 12/1977 | United Kingdom . |
| 8802879 | 4/1988 | WIPO . |

OTHER PUBLICATIONS

Kunststoff–Handbuch, vol. VII, pp. 45–71 (1966).

Murov, *Handbook of Photochemistry* pp. 27–35 (Marcell Dekker, NY 1973).

Vesley *Journal of Radiation Curing* Jan. (1986).

Cox, Jr., *J. Org. Chem.* 54, 2600 (1969).

Cotton and Wilkinson *Basic Inorganic Chemistry* 497 (1976).

Frisch and Reegan *Ring–Opening Polymerizations* vol. 2 (1969).

Lee and Neville *Handbook of Epoxy Resins* Appendix A (1967).

Bruins *Epoxy Resin Technology* (1968).

ENERGY-POLYMERIZABLE ADHESIVE, COATING, AND FILM

This is a division of application Ser. No. 07/823,819, filed Jan. 22, 1992, now U.S. Pat. No. 5,252,694.

BACKGROUND OF THE INVENTION

1. Field of the Invention

This invention relates to polymerizable compositions comprising an energy-polymerizable catalyst system, and cured adhesive films, pressure sensitive adhesives, protective coatings, liquid adhesives, structural and semi-structural adhesives, and free-standing films prepared therewith.

2. Description of the Related Art

Various polymeric coatings and articles are produced in processes involving the use of organic solvents. There is an intense effort by researchers and industry to promote high and 100% solids formulations and processes to reduce or eliminate the use of such solvents and the attendant costs and environmental contamination.

Radiation dual curable compositions containing unsaturated monomers and epoxy monomers have been described in a number of U.S. Pat. Nos. 4,156,035 (Tsao et al.), 4,227,978 (Barton), 4,428,807 (Lee et al.), 4,623,676 (Kistner), 4,657,779 (Gaske), and 4,694,029 (Land). Compositions described in the aforementioned patents include onium salts combined with organic compounds as the curing system.

U.S. Pat. No. 4,717,605 (Urban et al.) describes radiation curable adhesives based on the combination of an epoxide system and ionic photoinitiators of the triarylsulfonium complex type and at least one ethylenically unsaturated substance that can be polymerized by free radicals and at least one free radical photoinitiator. The adhesive described is a hardenable glue cured by two light exposures.

U.S. Pat. No. 4,677,137 (Bany et al.) describes a process using a supported onium salt or an ionic salt of an organometallic complex as the photoinitiator system for the polymerization of cationically polymerizable materials.

U.S. Pat. No. 4,707,432 (Gatechair et al.) describes a free radically polymerizable composition comprising a free radically polymerizable material and a photoinitiator system comprising an alpha-cleavage or homolytic bond cleavage photoinitiator and a ferrocenium salt.

WO 8802879 (Woods et al.) describes a free radically polymerizable composition comprising a free radically polymerizable material and a photoinitiator system comprising a free radical photoinitiator and a ferrocenium salt. Furthermore, the composition may contain one or more cationically polymerizable materials.

U.S. Pat. No. 4,849,320 (Irving et al.) describes a process using a combination of two different photoinitiators and two different polymerizable monomers in combination with irradiation at two substantially different wavelengths.

U.S. Pat. No. 4,751,138 (Tumey et al.) describes a coated abrasive article prepared by polymerizing a combination of epoxy and acrylate monomers using a combination of photoinitiators that can be a ferrocinium, onium salts or an alpha-cleavage or homolytic bond cleavage photoinitiator.

AU 8538551 (Meier et al.) describes a curable composition containing materials that are polymerizable by free radical or cationic mechanisms using an iron containing cationic organometallic compound and an electron acceptor as an oxidizing agent. The electron acceptors are preferably an organic hydroperoxide, an organic peracid or a quinone. The utility of this composition is in the preparation of protective coatings, adhesives, putties, or fiber reinforced composites and laminates.

U.S. Pat. No. 3,907,706 (Robins) describes a catalyst system comprising a metal salt of a fluoroalkane sulfonic acid and a thermally decomposable ester reaction product of a tertiary alkyl alcohol and an acid that forms a chelation complex with the metal ion of the metal salt. In some embodiments, the catalyst system includes a buffering compound that retards activity of the catalyst system.

SUMMARY OF THE DISCLOSURE

Briefly, in one aspect of the present invention, a polymerizable composition is provided comprising (1) at least one cationically polymerizable monomer and (2) a catalyst system comprising (a) at least one organometallic complex salt, and (b) a thermally decomposable ester reaction product of a tertiary alkyl alcohol and an acid that forms a chelation complex with the metal ion of the organometallic complex salt, and (c) optionally, a peroxide.

In another aspect of the present invention, a polymerizable composition is provided comprising (1) at least one free radically polymerizable monomer, (2) at least one cationically polymerizable monomer, and (3) a catalyst system comprising (a) at least one organometallic complex salt, (b) a thermally decomposable ester reaction product of a tertiary alkyl alcohol and an acid that forms a chelation complex with the metal ion of the organometallic complex salt, (c) optionally, at least one peroxide, and (d) optionally, at least one free radical initiator.

Advantageously, the compositions of the present invention, when utilized in 100% reactive coating compositions, substantially eliminate the generation of industrial solvent waste while reducing energy consumption.

In this application:
  "multi-color photoinitiation process" means photoinitiation of polymerization by sequentially or simultaneously irradiating a polymerizable mixture with radiation of substantially different wavelengths, such as described in U.S. Pat. No. 4,849,320;
  "energy-induced curing" means curing or polymerizing by means of electromagnetic radiation (ultraviolet and visible) accelerated particles (including electron beam), and thermal (infrared and heat) means or any combination thereof such as heat and light simultaneously, light then heat or heat then light;
  "free radically polymerizable monomer" means at least one monomer that polymerizes by a free-radical mechanism; it can be bireactive and includes acrylates and methacrylates, vinyl esters, and vinyl aromatic compounds;
  "cationically polymerizable monomer" means at least one monomer that polymerizes by a cationic mechanism, and it can be bireactive and includes epoxies, cyclic ethers, vinyl ethers, siloxanes, N-vinyl compounds, alpha-olefins, lactams, lactones;

"B-stage" means an intermediate state in a thermosetting resin reaction in which the material softens when heated, and swells, but does not dissolve in certain liquids, see ASTM Standard D907-91b;

"bireactive monomer" means a monomer that contains at least two free radically or two cationically polymerizable groups and does not contain both types of groups simultaneously;

"bifunctional monomer" means those monomers that contain both at least one free radically polymerizable group and at least one cationically polymerizable group;

"catalytically-effective amount" means a quantity of catalyst sufficient to effect polymerization of the curable composition to a polymerized product at least to a degree to cause an increase in the viscosity of the composition;

"organometallic salt" means an ionic salt of an organometallic complex cation, wherein the cation contains at least one carbon atom of an organic group that is bonded to a metal atom of the transition metal series (F. A. Cotton and G. Wilkinson *Basic Inorganic Chemistry* 497 (1976));

"buffer compound" means a substance that when added to a formulation resists a change in hydrogen ion concentration (pH) on addition of an acid or a base;

"transition metal series" means those metals in the Periodic Table Groups IVB, VB, VIB, VIIB, and VIII; and, "polymerizable composition" means a mixture where the ratio of (free radically polymerizable monomer):(cationically polymerizable monomer) is 0.1:99.9 to 99.9:0.1.

DESCRIPTION OF THE PREFERRED EMBODIMENT(S)

The present invention provides a polymerizable epoxy composition comprising:
(1) at least one cationically polymerizable monomer;
(2) a catalyst system comprising:
 (a) at least one organometallic complex salt,
 (b) a thermally decomposable ester reaction product of a tertiary alkyl alcohol and an acid that forms a chelation complex with the metal ion of the organometallic complex salt, and
 (c) optionally, peroxide;
(3) optionally, a buffer compound; and
(4) optionally, a mono- or polyfunctional alcohol.

In particular, the present invention provides a polymerizable epoxy composition comprising:
(1) 1 to 99 wt % of at least one cationically polymerizable monomer;
(2) 0.01 to 20 wt % of a catalyst system comprising:
 (a) 0.01 to 19.99 wt % of at least one organometallic complex salt,
 (b) 0.01 to 19.99 wt % of a thermally decomposable ester reaction product of a tertiary alkyl alcohol and an acid that forms a chelation complex with the metal ion of the organometallic complex salt, and
 (c) 0 to 20 wt % of a peroxide;
(3) 0 to 20 wt % of a buffer compound; and
(4) 0 to 50 wt % of a mono- or polyfunctional alcohol.

Adjuvants and thermo plastic materials can be added up to approx. 98 weight percent such that the sum of all the components is equal to 100 wt %.

The present invention further provides a polymerizable viscoelastic epoxy-acrylate composition comprising:
(1) at least one free radically polymerizable monomer;
(2) at least one cationically polymerizable monomer;
(3) a catalyst system comprising:
 (a) at least one organometallic complex salt,
 (b) a thermally decomposable ester reaction product of a tertiary alkyl alcohol and an acid that forms a chelation complex with the metal ion of the organometallic complex salt,
 (c) optionally, peroxide, and
 (d) optionally, at least one free radical initiator;
(4) optionally, a buffer compound; and
(5) optionally, a mono- or polyfunctional alcohol.

In particular, the present invention provides a polymerizable epoxy-acrylate composition comprising:
(1) 1 to 99 wt % of at least one free radically polymerizable monomer;
(2) 1 to 99 wt % of at least one free cationically polymerizable monomer;
(3) 0.01 to 20 wt % of a catalyst system comprising:
 (a) 0.01 to 19.99 wt % of at least one organometallic complex salt,
 (b) 0.01 to 19.99 wt % of a thermally decomposable ester reaction product of a tertiary alkyl alcohol and an acid that forms a chelation complex with the metal ion of the organometallic complex salt,
 (c) 0 to 20 wt % of a peroxide, and
 (d) 0 to 20 wt % of at least one free radical initiator;
(4) 0 to 20 wt % of a buffer compound, and
(5) 0 to 50 wt % of a mono- or polyfunctional alcohol.

Adjuvants and/or thermo plastic materials can be added up to approximately 97 weight percent such that the sum of all the components is equal to 100wt. %.

Cationically polymerizable monomers include epoxy-containing materials, alkyl vinyl ethers, cyclic ethers, styrene, divinyl benzene, vinyl toluene, N-vinyl compounds, 1-alkyl olefins (alpha-olefins), lactams and cyclic acetals.

Epoxy-containing materials that can be cured or polymerized by the catalyst system of this invention are those known to undergo cationic polymerization and include 1,2-, 1,3-, and 1,4-cyclic ethers (also designated as 1,2-, 1,3-, and 1,4-epoxides). The 1,2-cyclic ethers are preferred.

Cyclic ethers that can be polymerized in accordance with this invention include those described in Frisch and Reegan *Ring-Opening Polymerizations* Vol. 2 (1969). Suitable 1,2-cyclic ethers are the monomeric and polymeric types of epoxides. They can be aliphatic, cycloaliphatic, aromatic, or heterocyclic and will typically have an epoxy equivalence of from 1 to 6, preferably 1 to 3. Particularly useful are the aliphatic, cycloaliphatic, and glycidyl ether type 1,2-epoxides such as propylene oxide, epichlorohydrin, styrene oxide, vinylcyclohexene oxide, vinylcyclohexene dioxide, glycidol, butadiene oxide, diglycidyl ether of bisphenol A, cyclohexene oxide, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, bis(3,4-epoxy-6-methylcyclohexylmethyl)adipate, dicyclopentadiene dioxide, epoxidized polybutadiene, 1,4-butanediol diglycidyl ether, polyglycidyl ether of phenolformaldehyde resole or novolak resin, resorcinol diglycidyl ether, and epoxy silicones, e.g., dimethylsiloxanes having cycloaliphatic epoxide or glycidyl ether groups.

A wide variety of commercial epoxy resins are available and listed in Lee and Neville *Handbook Of Epoxy Resins* (1967) and in P. Bruins *Epoxy Resin Technology* (1968). Representative of the 1,3- and 1,4-cyclic ethers which can be polymerized in accordance with this invention are oxetane, 3,3-bis(chloromethyl)oxetane, and tetrahydrofuran.

In particular, cyclic ethers which are readily available include propylene oxide, oxetane, epichlorohydrin, tetrahydrofuran, styrene oxide, cyclohexene oxide, vinylcyclohexene oxide, glycidol, octylene oxide, phenyl glycidyl ether, 1,2-butane oxide, diglycidyl ether of bisphenol A (e.g., "Epon 828" and "DER 331"), vinylcyclohexene dioxide (e.g., "ERL-4206"), 3,4-epoxycyclohexylmethyl-3,4- epoxycyclohexanecarboxylate (e.g., "ERL-4221"), 3,4-epoxy-6-methylcyclohexylmethyl-3,4-epoxy-6-methylcyclohexanecarboxylate (e.g., "ERL-4201"), bis(3,4-epoxy-6-methylcyclohexylmethyl)adipate (e.g., "ERL-4299"), aliphatic epoxy modified with polypropylene glycol (e.g., "ERL-4050" and "ERL-4052"), dipentene dioxide (e.g., "ERL- 4269"), epoxidized polybutadiene (e.g., "Oxiron 2001 "), silicone epoxy (e.g., "Syl-Kem 90"), 1,4-butanediol diglycidyl ether (e.g., Araldite RD-2), polyglycidyl ether of phenolformaldehyde novolak (e.g., "DER- 431 "), Epi-Rez 521" and "DER-438"), resorcinol diglycidyl ether (e.g., Kopoxite"), polyglycol diepoxide (e.g., "DER-736"), polyacrylate epoxide (e.g., "Epocryl U-14"), urethane modified epoxide (e.g., "QX3599"), polyfunctional flexible epoxides (e.g., "Flexibilizer 151"), and mixtures thereof as well as mixtures thereof with co-curatives, curing agents or hardeners which also are well known (see Lee and Neville and Bruins, supra). Representative of the co-curatives of hardeners that can be used are acid anhydrides such as nadic methyl anhydride, cyclopentanetetracarboxylic dianhydride, pyromellitic anhydride, cis-1,2-cyclohexanedicarboxylic anhydride, and mixtures thereof.

Free radically polymerizable monomers can be selected from (meth)acrylates and vinyl ester functionalized materials. Of particular use are (meth)acrylates. They can be monomers and/or oligomers such as (meth)acrylates (meth)acrylamides, vinyl pyrrolidinone and azlactones. Such monomers include mono-, di-, or polyacrylates and methacrylates such as methyl acrylate, methyl methacrylate, ethyl acrylate, isopropyl methacrylate, isooctyl acrylate, acrylic acid, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3- propanediol dimethacrylate, trimethanol triacrylate, 1,2,4-butanetriol trimethylacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyl dimethylmethane, bis[1-(3-acryloxy-2-hydroxy)]-p-propoxyphenyl-dimethylmethane, tris-hydroxyethyl isocyanurate trimethacrylate; the bis-acrylates and bis-methacrylates of polyethylene glycols of molecular weight 200–500, copolymerizable mixtures of acrylated monomers such as those described in U.S. Pat. No. 4,652,274 (Boettcher et al.), and acrylated oligomers such as those described in U.S. Pat. No. 4,642,126 (Zador et al.), and such descriptions are incorporated herein by reference.

Bifunctional monomers may also be used and examples that are useful in this invention possess at least one free radically and one cationically reactive functionality. Examples of such monomers include, for example, glycidyl acrylate, glycidyl methacrylate, hydroxyethyl acrylate, hydroxyethyl methacrylate, hydroxypropyl methylacrylate, and hydroxybutyl acrylate.

Suitable organometallic complex salt include those described in U.S. Pat. No. 5,059,701 (Keipert), and such description is incorporated herein by reference. In addition to the organometallic complex salts described in U.S. Pat. No. 5,059,701 all the organometallic complex salts described in EPO No. 109,851 (Palazzotto et al.) are also useful in the present invention. The photoactive organometallic complex salts used in the present invention have the following formula:

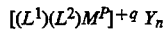

wherein $M^p$ represents a metal selected from the group consisting of: Cr, Mo, W, Mn Re, Fe, and Co;

$L^1$ represents 1 or 2 ligands contributing pi-electrons that can be the same or different ligand selected from the group of: substituted and unsubstituted $eta^3$-allyl, $eta^5$-cyclopentadienyl, and $eta^7$-cycloheptatrienyl, and $eta^6$-aromatic compounds selected from $eta^6$-benzene and substituted $eta^6$-benzene compounds and compounds having 2 to 4 fused rings, each capable of contributing 3 to 8 pi-electrons to the valence shell of $M^p$;

$L^2$ represents none, or 1 to 3 ligands contributing an even number of sigma-electrons that can be the same or different ligand selected from the group of: carbon monoxide, nitrosonium, triphenyl phosphine, triphenyl stibine and derivatives of phosphorus, arsenic and antimony, with the proviso that the total electronic charge contributed to $M^p$ results in a net residual positive charge of q to the complex;

q is an integer having a value of 1 or 2, the residual charge of the complex cation;

Y is a halogen-containing complex anion selected from $BF_4^-$, $AsF_6^-$, $PF_6^-$, $SbF_5OH^-$, $SbF_6^-$, and $CF_3SO_3^-$; and n is an integer having a value of 1 or 2, the number of complex anions required to neutralize the charge q on the complex cation;

Examples of suitable salts of organometallic complex cations useful in the composition of the invention include the ($eta^6$-benzene)($eta^5$-cyclopentadienyl)iron(1+) hexafluoroantimonate ($eta^6$-toluene)($eta^5$-cyclopentadienyl)iron(1+) hexafluoroarsenate ($eta^6$-cumene)($eta^5$-cyclopentadienyl)iron(1+) hexafluorophosphate ($eta^6$-p-xylene)($eta^5$-cyclopentadienyl)iron(1+) hexafluoroantimonate ($eta^6$-xylenes(mixed isomers))($eta^5$-cyclopentadienyl)iron (1+) hexafluoroantimonate ($eta^6$-xylenes(mixed isomers))($eta^5$-cyclopentadienyl)iron (1+) hexafluorophosphate ($eta^6$-o-xylene)($eta^5$-cyclopentadienyl)iron(1+) triflate ($eta^6$-m-xylene)($eta^5$-cyclopentadienyl)iron(1+) tetrafluoroborate (eta$^6$-mesitylene)(eta$^5$-cyclopentadienyl)iron(1+) hexafluoroantimonate (eta$^6$-hexamethylbenzene)(eta$^5$-cyclopentadienyl)iron(1+) pentafluorohydroxyantimonate (eta$^6$-naphthalene)(eta$^5$-cyclopentadienyl)iron(1+) tetrafluoroborate (eta$^6$-pyrene)(eta$^5$-cyclopentadienyl)iron(1+) triflate (eta$^6$-toluene)(eta$^5$-cyclopentadienyl)iron(1+) hexafluoroantimonate (eta$^6$-cumene)(eta$^5$-cyclopentadienyl)iron(1+) hexafluoroantimonate (eta$^6$-p-xylene)(eta$^5$-cyclopentadienyl)iron(1+) hexafluoroantimonate (eta$^6$-m-xylene)(eta$^5$-cyclopentadienyl)iron(1+) hexafluoroantimonate (eta$^6$-hexamethylbenzene)(eta$^5$-cyclopentadienyl)iron(1+) hexafluoroantimonate (eta$^6$-naphthalene)(eta$^5$-cyclopentadienyl)iron(1+) hexafluoroantimonate (eta$^6$-pyrene)(eta$^5$-cyclopentadienyl)iron(1+) hexafluoroantimonate (eta$^6$-chrysene)(eta$^5$-cyclopentadienyl)iron(1+) hexafluoroantimonate (eta$^6$-perylene)(eta$^5$-cyclopentadienyl)iron(1+) hexafluoroantimonate (eta$^6$-chrysene)(eta$^5$-cyclopentadienyl)iron(1+) pentafluorohydroxyantimonate (eta$^6$-acetophenone)(eta$^5$-methylcyclopentadienyl)iron(1+) hexafluoroantimonate (eta$^6$-fluorene)(eta$^5$-cyclopentadienyl)iron(1+) hexafluoroantimonate Examples of preferred salts of organometallic complex cations useful in the composition of the invention include one or more of the following:

(eta$^6$-xylenes(mixed isomers))(eta$^5$-cyclopentadienyl) iron (1+) hexafluoroantinomate (eta$^6$-xylenes(mixed isomers))(eta$^5$-cyclopentadienyl) iron (1+) hexafluorophosphate (eta$^6$-m-xylene)(eta$^5$-cyclopentadienyl)iron(1+) tetrafluoroborate (eta$^6$-o-xylene)(eta$^5$-cyclopentadienyl)iron(1+) hexafluoroantimonate (eta$^6$-p-xylenes)(eta$^5$-cyclopentadienyl)iron(1+) triflate (eta$^6$-toluene)(eta$^5$-cyclopentadienyl)iron(1+) hexafluoroantimonate (eta$^6$-cumene)(eta$^5$-cyclopentadienyl)iron(1+) hexafluoroantimonate (eta$^6$-p-xylene)(eta$^5$-cyclopentadienyl)iron(1+) hexafluoroantimonate (eta$^6$-m-xylene)(eta$^5$-cyclopentadienyl)iron(1+) hexafluoroantimonate (eta$^6$-hexamethylbenzene)(eta$^5$-cyclopentadienyl)iron(1+) hexafluoroantimonate (eta$^6$-naphthalene)(eta$^5$-cyclopentadienyl)iron(1+) hexafluoroantimonate (eta$^6$-pyrene)(eta$^5$-cyclopentadienyl)iron(1+) hexafluoroantimonate (eta$^6$-chrysene)(eta$^5$-cyclopentadienyl)iron(1+) hexafluoroantimonate (eta$^6$-mesitylene)(eta$^5$-cyclopentadienyl)iron(1+) hexafluoroantimonate (eta$^6$-cumene)(eta$^5$-cyclopentadienyl)iron(1+) hexafluorophosphate (eta$^6$-mesitylene)(eta$^5$-cyclopentadienyl)iron(1+) pentafluorohydroxyantimonate (eta$^6$-toluene)(eta$^5$-cyclopentadienyl)iron(1+) hexafluoroarsenate In general, the thermally decomposable ester reaction products of a tertiary alkyl alcohol and an acid that forms a chelation complex with the metal ion of the organometallic complex salt useful in the invention (hereinafter for brevity also referred to as "ester reaction products") are soluble compounds that upon heating, preferably to a temperature of 100° C. or more, decompose to release the chelating acid. Since the released acid forms a nonionizing chelation complex with the metal atom, the chelation reaction tends to remove metal atoms from a solution of the photolyzed cationic organometallic salt. Thereupon, the acid of the salt anion is released for reaction to catalyze polymerization of the polymerizable material in the system.

The ester reaction products are prepared from tertiary alkyl alcohols and any tertiary alkyl alcohol that forms an ester reaction product with an appropriate acid may be used. Examples of suitable tertiary alkyl alcohols are t-butanol, 1,1-dimethylpropanol, 1-methyl-2-ethylpropanol, 1,1-dimethyl-n-butanol, 1,1-dimethyl-n-pentanol, 1,1-dimethylisobutanol, 1,1,2,2-tetramethylpropanol, 1-methylcyclopentanol, 1-methylcyclohexanol, 1,1-dimethyl-n-hexanol, 1,1-dimethyl-n-octanol, 1,1-diphenylethanol, and 1,1-dibenzyl ethanol.

Chelating acids for inclusion in acid generating esters of the invention are oxalic, phosphoric and phosphorous acids. Other illustrative chelating acids that are useful include, polycarboxylic acids, for example, malonic, succinic, fumaric, maleic, citraconic, aconitic, o-phthalic, trimesic acids and other polycarboxylic acids having less than 3 carbon atoms separating the carboxylic groups; hydroxycarboxylic acids, for example, glycolic, lactic, beta-hydroxybutyric, gamma-hydroxybutyric, tartronic, malic, oxalacetic, tartaric, and citric acids; aldehydic and ketonic acids, for example, glyoxylic, pyruvic, and acetoacetic acids; other acids of phosphorus; chromic acids; and vanadic acid.

The acid-generating esters may be prepared by procedures well known in the art. For example, acid-generating esters that incorporate the organic acids may be prepared by procedures described by Karabatsos et al. *J. Org. Chem.* 30, 689 (1965). Esters that incorporate phosphate, phosphonate and phosphite esters can be prepared by procedures described by Cox, Jr. *J. Am. Chem. Soc'y* 80, 5441 (1958); Goldwhite *J. Am. Chem. Soc'y* 79, 2409 (1957); and Cox, Jr. *J. Org. Chem.* 54, 2600 (1969), respectively.

The acid-generating ester should be relatively nonhydrolyzable and is essentially free of acid. To remove traces of acid from the acid-generating ester, it may be passed through a column filled with an ion exchange resin.

Depending on the nature of the olefin that is formed from the acid-generating ester that is used, blown or solid polymerization products may be obtained. Generally, solid, unfoamed polymerization products are obtained when the olefin formed has a boiling point of at least about 70° C. and preferably at least 100° C. at atmospheric pressure, while blown or foamed polymerization products are obtained when the olefin formed has a boiling point of less than about 70° C. Acid-generating esters derived from tertiary alcohols having 6 or more carbon atoms generally give olefins having a boiling point of at least 70° C., and tertiary alcohols having 9 or more carbon atoms generally give olefins having a boiling point of at least about 100° C. The preferred ester reaction product is oxalate, phosphate, phosphinate, and phosphonate.

Also useful in accelerating the cationic polymerization when used in combination with the cationic organometallic photocatalyst and the acid-generating ester are peroxides: acyl peroxides such as benzoyl peroxide; alkyl peroxides such as t-butyl peroxide; hydroperoxides such as cumyl hydroperoxide; peresters such as t-butyl perbenzoate; dialkyl peroxydicarbonates such as di(sec-butyl)peroxydicarbonate; diperoxyketals; and ketone peroxides such as methylethylketone peroxide.

The optional additional free radical initiators can be selected from those compounds which generate free radicals upon exposure to heat or radiation, e.g., those compounds disclosed in "Mechanism of the Photodecomposition of Initiators", G. F. Vesley, *Journal of Radiation Curing*, January, 1986, incorporated herein by reference. They are selected from acetophenones and ketals, benzophenones, aryl glyoxalates, acylphosphine oxides, sulfonium and iodonium salts, diazonium salts, and peroxides. Preferred additional free radical initiators that are light activated are those that have an absorption maximum in the 300 to 400 nm region of the electromagnetic spectrum.

Especially useful are acetophenones and ketals, described in U.S. Pat. No. 4,318,791 and incorporated herein by reference. Examples of preferred acetophenones and ketals useful in compositions of the present invention include, but are not limited to the following:
2,2-dimethoxyacetophenone
2,2-dimethoxy-2-phenylacetophenone
2,2-diethoxyacetophenone
2,2-dibutoxyacetophenone
2,2-dihexoxyacetophenone
2,2-di(2-ethylhexoxy)acetophenone
2,2-diphenoxyacetophenone
2,2-ditolyloxyacetophenone
2,2-di(chlorophenyl)acetophenone
2,2-di(nitrophenyl)acetophenone
2,2-diphenoxy-2-phenylacetophenone
2,2-dimethoxy-2-methylacetophenone
2,2-dipropoxy-2-hexylacetophenone
2,2-diphenoxy-2-ethylacetophenone
2,2-dimethoxy-2-cyclopentylacetophenone
2,2-di (2-ethylhexyl)-2-cyclopentylacetophenone
2,2-diphenoxy-2-cyclopentyl-acetophenone
2,2-di(nitrophenoxy)-2-cyclohexylacetophenone
2,2-dimethyl-2-hydroxyacetophenone
2,2-diethoxy-2-phenylacetophenone
2,2-diphenethyloxy-2-phenylacetophenone
2,2-(2-butenediyloxy)-2-phenylacetophenone
2,2-dimethyl-2-morpholino-(p-thiomethyl)acetophenone
1-hydroxycyclohexyl phenyl ketone.

Also preferred are aromatic onium salts. These salts are disclosed, for example, in U.S. Pat. Nos. 4,069,054, 4,231,951 and 4,250,203. The preferred aromatic halonium salts include, but are not limited to diazonium, iodonium, and sulfonium salts, more preferably selected from diphenyliodonium, triphenylsulfonium and phenylthiophenyl diphenylsulphonium salts of hexafluorophosphate, hexafluoroantimonate, triflate, hexafluoroarsenate, hydroxypentafluoroantimonate and tetrafluoroborate.

Photoinitiators that are useful for partially polymerizing alkyl acrylate monomer without crosslinking, to prepare the above-identified syrup, include the benzoin ethers, such as benzoin methyl ether or benzoin isopropyl ether, substituted benzoin ethers, such as anisoin methyl ether, substituted acetophenones, such as 2,2-diethoxyacetophenone and 2,2-dimethoxy-2-phenylacetophenone, substituted alpha-ketols, such as 2-methyl-2-hydroxypropiophenone, aromatic sulfonyl chlorides, such as 2-naphthalene-sulfonyl chloride, and photoactive oximes, such as 1-phenyl-1,1-propanedione-2(o-ethoxycarbonyl)oxime. They may be used in amounts, which as dissolved provide about 0.001 to 0.5 percent by weight of the alkyl acrylate monomer, preferably at least 0.01 percent.

The catalyst system should be present in an amount effective to produce polymerization with the application of energy. Generally, the catalyst system can be present in the range of 0.01 to 20, preferably 0.1 to 10 weight percent of the total curable composition. The ratio of organometallic complex salt to thermally decomposable ester reaction product of a tertiary alkyl alcohol and an acid is typically in the range of 100:1 to 1:100 of the catalyst system. Preferably, the ratio is in the range of 10:1 to 1:10. The ratio of the organometallic complex salt/ester reaction product mixture to free radical initiator, if present, is generally in the range of 1:100 to 100:1. Preferably, the ratio is in the range of 1:10 and 10:1.

In general, optional buffer compounds that may be used in some catalyst combinations of the invention to achieve a balance between latency and reactivity are basic compounds having a solubility in the whole composition of at least about 1 part by weight per 1000 parts by weight of the whole composition. For example, salts that behave as buffers are salts of carboxylic acids, sulfonic acid or phosphoric acid.

It is also within the scope of this invention to add mono- or polyfunctional alcohols to the curable composition. Suitable examples alcohols include but are not limited to methanol, ethanol, 1-propanol, 2-propanol, 1-butanol, 1-pentanol, 1-hexanol, 1-heptanol, 1-octanol, pentaerythritol, 1,2-propanediol, ethylene glycol, 1,4-butanediol, 1,5-pentanediol, 1,6-hexanediol, 1,4-cyclohexane dimethanol, 1,4-cyclohexanediol and glycerol.

Preferably, compounds containing hydroxyl groups, particularly compounds containing from about 2 to 50 hydroxyl groups and above all, compounds having a weight avenge molecular weight of from about 50 to 25,000, preferably from about 50 to 2,000, for example, polyesters, polyethers, polythioethers, polyacetals, polycarbonates, poly(meth)acrylates, and polyester amides, containing at least 2, generally from about 2 to 8, but preferably from about 2 to 4 hydroxyl groups, or even hydroxyl-containing prepolymers of these compounds, are representatives compounds useful in accordance with the present invention and are described, for example, in Saunders, *High Polymers*, Vol. XVI, "Polyurethanes, Chemistry and Technology," Vol. I, pages 32–42, 44–54 and Vol. II, pages 5–6, 198–99 (1962, 1964), and in *Kunststoff-Handbuch*, Vol. VII, pages 45–71 (1966). It is, of course, permissible to use mixtures of the above-mentioned compounds containing at least two hydroxyl groups and having a molecular weight of from about 50 to 50,000 for example, mixtures of polyethers and polyesters.

In some cases, it is particularly advantageous to combine low-melting and high-melting polyhydroxyl containing compounds with one another (German Offenlegungsschrift No. 2,706,297).

Low molecular weight compounds containing at least two reactive hydroxyl gropups (molecular weight from about 50 to 400) suitable for use in accordance with the present invention are compounds preferably containing hydroxyl groups and generally containing from about 2 to 8, preferably from about 2 to 4 reactive hydroxyl groups. It is also possible to use mixtures of different compounds containing at least two hydroxyl groups and having a molecular weight in the range of from about 50 to 400. Examples of such compounds are ethylene glycol, 1,2- and 1,3-propylene glycol, 1,4- and 2,3-butylene glycol, 1,5-pentanediol, 1,6-hexanediol, 1,8-octanediol, neopentyl glycol, 1,4-cyclohexane dimethanol, 1,4-cyclohexanediol, trimethylolpropane, 1,4-bis- hydroxymethyl cyclohexane, 2-methyl-1,3-propanediol, dibromobutenediol (U.S. Pat. No. 3,723,392 (Konig et al.), glycerol, trimethylolpropane, 1,2,6-hexanetriol, trimethylolethane, pentaerythritol, quinitol, mannitol, sorbitol, diethylene glycol, triethylene glycol, tetraethylene glycol, higher polyethylene glycols, dipropylene glycol, higher polypropylene glycols, dibutylene glycol, higher polybutylene glycols, 4,4'-dihydroxy diphenyl propane and dihydroxy methyl hydroquinone.

Other polyols suitable for the purposes of the present invention are the mixtures of hydroxy aldehydes and hydroxy ketones ("formose") or the polyhydric alcohols obtained therefrom by reduction ("formitol") which are formed in the autocondensation of formaldehyde hydrate in the presence of metal compounds as catalysts and compounds capable of enediol formation as co-catalysts (German Offenlegungsschrift Nos. 2,639,084, 2,714,084, 2,714,104, 2,721,186, 2,738,154 and 2,738,512).

It is contemplated that polyfunctional alcohols such as carbowaxes poly(ethylene glycol), poly(ethylene glycol methyl ether), poly(ethylene glycol) tetrahydrofurfuryl ether, poly(propylene glycol) may also be used in the compositions of the present invention.

It is also within the scope of this invention to add optional adjuvants such as thixotropic agents; plasticizers; toughening agents such as those taught in U.S. Pat. No. 4,846,905 (Tarbutton et al.); pigments; fillers; abrasive granules, stabilizers, light stabilizers, antioxidants, flow agents, bodying agents, flatting agents, colorants, binders, blowing agents, fungicides, bactericides, surfactants; glass and ceramic beads; and reinforcing materials, such as woven and nonwoven webs of organic and inorganic fibers, such as polyester, polyimide, glass fibers and ceramic fibers; and other additives as known to those skilled in the art can be added to the compositions of this invention. These can be added in an amount effective for their intended purpose; typically, amounts up to about 25 parts of adjuvant per total weight of formulation can be used. They can modify the properties of the basic composition to obtain a desired effect. They can be reactive components such as materials containing reactive hydroxyl functionality. They can be also substantially unreactive, such as fillers both inorganic and organic.

Optionally, it is within the scope of this invention to include photosensitizers or photoaccelerators in the radiation-sensitive compositions. Use of photosensitizers or photoaccelerators alters the wavelength sensitivity of radiation-sensitive compositions employing the latent catalysts of this invention. This is particularly advantageous when the latent catalyst does not strongly absorb the incident radiation. Use of a photosensitizer or photoaccelerator increases the radiation sensitivity allowing shorter exposure times and/or use of less powerful sources of radiation. Any photosensitizer or photoaccelerator may be useful if its triplet energy is at least 45 kilocalories per mole. Examples of such photosensitizers are given in Table 2-1 of the reference, S. L. Murov, Handbook of Photochemistry, Marcel Dekker Inc., N.Y., 27–35 (1973), and include pyrene, fluoranthrene, xanthone, thioxanthone, benzophenone, acetophenone, benzil, benzoin and ethers of benzoin, chrysene, p-terphenyl, acenaphthene, naphthalene, phenanthrene, biphenyl, substituted derivatives of the preceding compounds, and the like. When present, the mount of photosensitizer of photoaccelerator used int the practice of the present invention is generally in the range of 0.01 to 10 parts, and preferably 0.1 to 1.0 parts, by weight of photosensitizer or photoaccelerator per part of organometallic salt.

Compositions of this invention are useful for coatings, foams, shaped articles, adhesives, filled or reinforced composites, abrasives, caulking and sealing compounds, casting and molding compounds, potting and encapsulated compounds, impregnating and coating compounds, and other applications which are known to those skilled in the art. Compositions of this invention may be used in the production of articles useful in the graphic arts such as printing plates and printed circuits. Methods of producing printing plates and printed circuits from photopolymerizing compositions are well known in the art (see for example British Patent Specification No. 1,495,746).

Glass microbubbles having an average diameter of 10 to 200 micrometers can be blended with polymerizable compositions of this invention as taught in U.S. Pat. No. 4,223,067 (Levens). If the microbubbles comprise 20 to 65 volume percent of the pressure-sensitive adhesive, the polymerized product will have a foam-like appearance and be suitable for uses to which foam-backed pressure-sensitive adhesive tapes are useful.

Conducting particles, as taught in U.S. Pat. No. 4,606,962 (Reylek et al.) can be blended with the polymerizable compositions of this invention. The conducting particles, such as metal-coated particles, or metal flakes, added to the polymerizable compositions of this invention can provide electrical conduction between semiconductor chips and circuit traces. Advantageously, such a conducting adhesive layer eliminates solder and provides better mechanical strength. Furthermore, more connections per area (pitch) can be realized using a conducting adhesive. The elimination of solder is environmentally safer, in that hazardous solvents and lead from solder are eliminated.

Other materials that can be blended with the polymerizable compositions of this invention include tackifiers, reinforcing agents, and other modifiers, some of which may copolymerize with the free radically or cationically polymerizable monomers or photopolymerize independently. However, the addition of any such material adds complexity and hence expense to an otherwise simple, straightforward, economical process and is not preferred except to achieve specific results. Preformed polymers useful as film formers include for example, polymethacrylate, polystryene, poly(vinylacetate), poly(butadiene), polybutylacrylate, poly(caprolactone), polycarbonate, poly(dimethylsiloxane), poly(ethylene oxide), poly(isoprene), poly(isobutylene), poly(alpha-methylstyrene), poly(vinyl chloride), polyvinylpyrrolidone.

While it is preferred that solvents are not used in preparing the polymerizable compositions of the present invention, solvents, preferably organic, can be used to assist in dissolution of the catalyst system in the free radically and cationically polymerizable monomers. It may be advantageous to prepare a concentrated solution of the organometallic complex salt in a solvent to simplify the preparation of the polymerizable composition. Representative solvents include acetone, methyl-ethyl-ketone, cyclopentanone, methyl cellosolve acetate, methylene chloride, nitromethane, methyl formate, gamma-butyrolactone, and 1,2-dimethoxyethane (glyme).

In some applications, it may be advantageous to adsorb the catalyst system onto an inert support such as silica, alumina, clays, etc., as described in U.S. Pat. No. 4,677,137 (Bany et al.).

The present invention also provides a process for preparing epoxy-acrylate materials, comprising the steps of:

(1) providing a substrate,
(2) coating a polymerizable composition as described above comprising:
  (a) at least one free radically polymerizable monomer;
  (b) at least one cationically polymerizable monomer;
  (c) a catalyst system comprising:
    (i) at least one organometallic complex salt,
    (ii) a thermally decomposable ester reaction product of a tertiary alkyl alcohol and an acid that forms a chelation complex with the metal ion of the organometallic complex salt, and
    (iii) optionally, peroxide, and
    (iv) optionally, at least one free radical initiator;
  (d) optionally, a buffer compound; and
  (e) optionally, a mono- or polyfunctional alcohol, to the substrate by methods known in the art, such as bar, knife, reverse roll, knurled roll, or spin coatings, or by spraying, brushing, and the like, with or without a coating solvent, and
(3) evaporating solvent, if present,
(4) applying energy to the article to cause the polymerization of the coating, preferably utilizing a technique called the "multi-color photoinitiation process," such that the polymerized composition is sequentially or simultaneously irradiated with light sources that provide radiation of substantially different wavelengths.

A process for the polymerization of the epoxy-acrylate thermoset resins (also referred to as "thermoset resin" or "resin composition") composition may be carried out all at once or in a stepwise fashion. The resin composition comprises an acrylate syrup, that is a mixture of partially polymerized free radical monomers (0.0 to 15.0% conversion); substantially unpolymerized epoxy monomers; and optional adjuvants. "Acrylate syrup" as used in this application means a composition comprising a partially polymerized mixture of acrylates only or a partially polymerized mixture of acrylates and unpolymerized epoxy monomers.

Method A

A first step in the preparation of the acrylate syrup is to mix the polymerizable monomers (cationically and free radically polymerizable monomers) with a catalytically effective amount of a free radical initiator. Preferably, the free radical initiator is not a crosslinking agent and is generally present in an amount within the range of 0.01 to 10.0% by weight of the polymerizable composition, preferably in the range of 0.02 to 1.0% by weight of the polymerizable composition.

The second step is to apply energy to the polymerizable composition and allowing it to polymerize such that the viscosity is increased to within a range of 0.3 to 20.0 Pascal seconds (Pa.s) at ambient temperature. Preferably, the viscosity after this step is in the range of 0.5 to 2.0 Pa.s. The increased viscosity provides an acrylate syrup that is a more suitable coating composition for the production of the articles of the invention. The polymerizable composition may be polymerized using any well-known thermal polymerization techniques and quenched with air to attain the desired viscosity. Preferably, the free radical initiator is a photoinitiator, and the partial polymerization may be stopped at any point by eliminating the irradiation source.

A third step is to mix at least one organometallic complex salt and any optional bireactive free radically polymerizable monomer, bifunctional monomer, adjuvants and additional amount of the above-identified free radical initiator into the acrylate syrup.

A fourth step is to degas the curable compositions under vacuum to remove bubbles and dissolved oxygen. Although it is preferable to do this step just prior to coating, it may be carried out at any time from a few hours to several weeks prior to coating. To insure stability of the degassed curable compositions, it is preferable to keep them from unwanted exposure to light.

Method B

Alternatively, if the free radically polymerizable composition is derived from a mixture of one or more alkyl (meth)acrylates, an acrylate syrup of the free radically polymerizable monomers can be prepared without the addition of cationically polymerizable monomers.

The first step in the alternative method is to mix the free radically polymerizable monomers with a catalytically effective amount of a free radical initiator. Preferably, this free radical initiator is not a crosslinking agent and generally is present the amounts in the range of 0.01 to 10.0% by weight of the free radically polymerizable components, and preferably in the range of 0.02 to 1.0% by weight.

The second step is to apply energy to the polymerizable composition and allow it to polymerize such that the viscosity is increased to within a range of 0.3 to 20.0 Pa.s at ambient temperature. Preferably, the viscosity after this step is in the range of 0.5 to 2.0 Pa.s. The increased viscosity provides a syrup that is a more suitable coating composition for the production of the articles of the invention.

The polymerizable composition can be polymerized by any well-known thermal polymerization techniques and quenched with air to attain the desired viscosity. It is preferable to use a photoinitiator as the free radical initiator in this process, such that the partial polymerization may be stopped at any point by eliminating the irradiation source and then quenching polymerization with oxygen. It is preferable to use a low intensity irradiation source in this photochemical process and that the mixture be cooled during irradiation. Low intensity irradiation and cooling minimize gel formation during the syrup making process. After quenching the polymerization, optional bireactive monomers, bifunctional monomers, adjuvants and additional free radical initiators may be added.

The cationic initiator is then added to a cationically polymerizable material. If the cationic initiator is not readily soluble, dissolution can be aided by the application of heat. When heating the cationic initiator in the presence of the cationic, ally polymerizable material, it is advantageous to reduce its exposure to light, thus minimizing the risk of unwanted polymerization. The cationic initiator can also be dissolved in a suitable solvent first and then added to the cationically polymerizable material.

It is also permissible to add the optional bireactive monomers, bifunctional monomers, adjuvants and additional free radical initiators to this composition.

The acrylate syrup and cationically polymerizable mixture are then mixed together. While it is permissible to mix the components in any order, it is preferable to add the acrylate syrup to the cationically polymerizable mixture. If optional bireactive monomers, bifunctional monomers, adjuvants and additional free radical initiators have not been added previously, they may be added at this time. The composition is thoroughly mixed to provide an even distribution of material.

The curable compositions are degassed under vacuum to remove bubbles and dissolved oxygen. While it is preferable to do this step just prior to coating, it can be carried out at any time from a few hours to several weeks prior to coating. To insure stability of the degassed curable compositions, it is preferable to keep them from unwanted exposure to light.

Method C

If the monomers are derived from the reaction product of (meth)acrylic acid and alcohol containing a heteroatom, oxygen, nitrogen, or sulfur in the chain, that is, polar (meth)acrylates, the monomers tend to gel, becoming crosslinked during the next stage of the syrup-making process and therefore difficult to use in any subsequent process. This has generally made these types of monomers unsuitable for syrup manufacture. It was surprising to find that the simple addition of an alkyl (meth)acrylate or other additives that can be broadly classified as chain transfer agents reduce or eliminate this tendency to form gels during the syrup-making process.

If, for example, an alkyl (meth)acrylate is used, then it can be used in any ratio with the polar acrylate. The ratio can be selected to control the final physical properties of the cured composition. The ratios can vary from 99:1 to 1:99, polar (meth)acrylate:alkyl (meth)acrylate. Generally, some intermediate ratio would be selected to optimize the contributions from the different monomers. The preferred range would be 80:20 to 20:80.

If, on the other hand, a chain transfer agent is used to inhibit gel formation in the polar acrylates, then a ratio of chain transfer agent:polar acrylate would be 10:90 to 0.5:99.5, preferably 5:95 to 0.5:99.5. Chain transfer agents useful in practicing the present invention are described in G. Odian *Principles of Polymerization* 253–59, at 252 (3d ed. 1991). Suitable chain transfer agents possess at least one abstractable hydrogen atom (that is, hydrogen atoms attached to a carbon atom adjacent to a heteroatom, such as, O, N, S, or hydrogen atoms attached to a secondary or tertiary carbon atom) but do not possess a free radically polymerizable group. For example, tetrahydrofuran (THF) would be a suitable chain transfer agent, however, the (meth)acrylated THF would not be suitable.

A second step is to apply energy to the polymerizable composition and allowing it to polymerize so that the viscosity is increased. This will provide a acrylate syrup generally having a viscosity of 300 to 20,000 centipoise at ordinary room temperature. Preferably, a suitable viscosity after this step is in the range of 500 to 2000 centipoise. The increased viscosity provides a composition that is more suitable coating composition for the production of the articles of the invention.

This partial polymerization process can be accomplished by conventional thermal polymerization techniques and then quenched with air to attain the desired viscosity. It is preferable to use a photoinitiator for this process, the partial polymerization may be stopped at any point simply be mining off the irradiation source and the polymerization can be quenched with oxygen. It is preferable to use a low intensity irradiation source in this photochemical process and that the mixture be cooled during irradiation. Low intensity irradiation and cooling minimize gel formation during the syrup making process. It is desirable to cool the composition to 10° C. or less to control any exotherm produced during the polymerization process.

After stopping the polymerization, optional bireactive monomers, bifunctional monomers, adjuvants and additional free radical initiators may be added.

The cationic organometallic is added to the cationically polymerizable material. If the cationic organometallic is not readily soluble, its dissolution can be aided by the application of heat. When heating the cationic organometallic in the presence of the cationically polymerizable material, it is advantageous to reduce its exposure to light. This will minimize the risk of unwanted polymerization. The cationic organometallic can also be dissolved in a suitable solvent first and then added to the cationically polymerizable material. It is also possible to add the optional bireactive monomers, bifunctional monomers, adjuvants and additional free radical initiators to this composition.

The acrylate syrup and cationically polymerizable mixture are mixed. While it is possible to mix the components in any order, it is preferred to add the acrylate syrup to the cationically polymerizable mixture. If the optional bireactive monomers, bifunctional monomers, adjuvants and additional free radical initiators have not been added previously, they can be added at this time. The composition is thoroughly mixed to provide an even distribution of material.

The curable compositions are degassed under vacuum. This helps to remove bubbles and dissolved oxygen. While it is preferable to do this step just prior to coating, it can be carried any time from a few hours to days even weeks before the actual coating. To keep these curable compositions stable, it is preferable to keep them from unwanted exposure to light.

The syrup from Methods (A), (B), or (C) may be coated onto a backing member and exposed to energy to complete the polymerization. The preferred method is by sequential exposure to irradiation of substantially different wavelengths to complete the polymerization, said process being called the "multi-color photoinitiation process."

Temperature of polymerization and amount of catalyst will vary and be dependent on the particular curable composition used and the desired application of the polymerized or cured product. The mount of curing agent to be used in this invention should be sufficient to effect polymerization of the polymerizable mixtures (that is, a catalytically-effective amount) under the desired use conditions. Such mount generally will be in the range of about 0.01 to 20 weight percent, and preferably 0.1 to 10.0 weight percent, based on the weight of curable composition.

For those compositions of the invention that are radiation-sensitive, compositions containing an organometallic complex salt of Formula I and, optionally, a free radical photoinitiator, any source of radiation including electron beam radiation, gamma radiation, and radiation sources emitting active radiation in the ultraviolet and visible region of the spectrum (e.g., about 200 to 800 nm) can be used. Suitable sources of radiation include mercury vapor discharge lamps, carbon arcs, tungsten lamps, xenon lamps, lasers, sunlight, etc. The required amount of exposure to effect polymerization is dependent upon such factors as the identity and concentrations of the organometallic complex salt and optional free radical photoinitiator, the particular free radically and cationically polymerizable monomers, the thickness of the exposed material, type of substrate, intensity of the radiation source and amount of heat associated with the radiation.

For the multi-color photoinitiation press, light of various wavelengths can be provided in a number of ways. Different light sources of substantially different wavelengths can be used. The wavelengths of major intensity for each light source can be obtained from the examination of the spectral output of each source. One light source could be used for different wavelength regions through the use of filters or monochromators. Lasers or other monochromatic light sources would be useful. For example, a tungsten lamp, whose output is mainly in the visible region, could be used as one light source while a lamp like the Sylvania 40 watt F-40/350B1, whose output is concentrated around 360 nm, could be used as another source.

Irradiation sources that provide light in the region from 200 to 800 nm are effective in the practice of this invention. A preferred region is between 250 to 700 nm. It is preferred to use a combination of wavelengths such as 250 to 400 nm for the ultraviolet and 350 to 700 nm for the visible, either sequentially or simultaneously or in multiple steps. It is most preferred to irradiate, first in the region where the catalyst system of the minor polymerizable component absorbs, followed by radiation in the region wherein the catalyst system of the major polymerizable component absorbs.

Thermal polymerization using direct heating or infrared electromagnetic radiation, as is known in the art, can be used to cure the free radically and cationically polymerizable monomers according to the teachings of this invention. It is also possible to use microwave irradiation to provide energy to cure the compositions of this invention.

It is within the scope of this invention to include multi-stage curing by first activating the curing system by irradiating the curable compositions sequentially or simultaneously with radiation of substantially different wavelengths. In addition, it may be desirable to subsequently [after the irradiation step(s)] thermally cure the activated precursor so obtained, the irradiation temperatures being below the temperature employed for subsequent heat-curing. These activated precursors may normally be cured at temperatures which are substantially lower than those required for the direct thermal curing, with an advantage in the range from 50° to 110° C. This multi-stage curing also makes it possible to control the polymerization in a particularly simple and advantageous manner.

It is often advantageous to protect the curable composition from premature exposure to light. This prevents the premature photoinitiation of polymerization. This can be accomplished by working under lights that do not activate the composition, such as darkroom safelights. Or it is possible to work under low intensity visible light for short periods of time without deleterious effect. Vessels in which the curable compositions are stored can be placed within light tight containers. It is even possible to work under ordinary room fluorescent lights for brief periods without any harm.

In the current state of the art, photopolymerization is carded out in an inert atmosphere. Any inert atmosphere such as nitrogen, carbon dioxide, helium or argon is suitable. A sufficiently inert atmosphere can be achieved by coveting a layer of the photoactive mixture with a plastic film which is transparent to ultraviolet radiation and irradiating through that film in air.

Objects and advantages of this invention are further illustrated by the following examples, but the particular materials and amounts thereof recited in these examples, as well as other conditions and details, should not be construed to unduly limit this invention.

| GLOSSARY | |
| --- | --- |
| Epon 828 | diglycidyl ether of bisphenol A (epoxy equivalent weight of 185–192 g/eq), (available from Shell Chemical Company); |
| Epon 1001F | diglycidyl ether of bisphenol A (epoxy equivalent weight of 525–550 g/eq), (available from Shell Chemical Company); |
| DPL-862 | diglycidyl ether of bisphenol F (epoxy equivalent weight of 166–177 g/eq), (available from Shell Chemical Company); |
| ERL-4299 | bis(3,4-epoxy-6-methylcyclohexyl-methyl) adipate, (available from Union Carbide Corporation); |
| ERL-4221 | 3,4-epoxycyclohexylmethyl-3,4-epoxy-cyclohexanecarboxylate, (available from Union Carbide Corporation); |
| DEN-439 | epoxy novolac resin (epoxy equivalent weight of 191–210 g/eq), (available from Dow Chemical Company); |
| Quatrex1 | high purity liquid bisphenol A-based epoxy resin (epoxy equivalent weight of 182–190 g/eq), (available from Dow Chemical Company under trade designation "Quatrex 1010"); |
| Quatrex2 | high purity solid bisphenol A-based epoxy resin (epoxy equivalent weight of 440–575 g/eq), (available from Dow Chemical Company under trade designation "Quatrex 1410"); |
| COM | $(\eta^6$-xylenes$)(\eta^5$-cyclopentadienyl) iron (1+) hexafluoroantimonate; |
| tBOX | di-t-butyl oxalate, (available from Aldrich Chemical Company); |
| bBOX | di-benzyl-t-butyl oxalate, (prepared according to Karabatsos et al. J. Org. Chem, 30, 689 (1965)); |
| CHDM | 1,4-cyclohexane dimethanol, (available from Eastman Chemical Company); |
| Irgacure 261 | Cp(Cum)Fe$^+$PF$_6^-$, (available from Ciba-Giegy Company); |
| KB-1 | benzil dimethoxy ketal (2-phenyl-2,2′-dimethoxyacetophenone), (available from Sartomer Company under the trade designation of Esacure ™ KB-1); |
| Cp(Mes)Fe$^+$SbF$_6^-$ | $(\eta^6$-mesitylene$)(\eta^5$-cyclopentadienyl) iron (1+) hexafluoroantimonate; |
| Cp(Mes)Fe$^+$PF$_6^-$ | $(\eta^6$-mesitylene$)(\eta^5$-cyclopentadienyl) iron (1+) hexafluorophosphate; |
| Cp(Mes)Fe$^+$BF$_4^-$ | $(\eta^6$-xylenes$)(\eta^5$-cyclopentadienyl) iron (1+) tetrafluoroborate; |
| IBA | isobornyl acrylate (available from Sartomer Company under the trade designation SR-506); |

-continued
GLOSSARY

| | |
|---|---|
| THFA | 2-tetrahydrofurfuryl acrylate, (available from Sartomer Company under the trade designation SR-285); |
| HDDA | 1,6-hexane diol diacrylate, (available from Sartomer Company under the trade designation SR-238); |
| BDDA | 1,4-butane diol diacrylate, (available from Sartomer Company under the trade designation SR-213); |
| TEGDA | tetraethylene glycol diacrylate, (available from Sartomer Company under the trade designation SR-268); |
| CHDM | 1,4-cyclohexane dimethanol, (available from Eastman Chemical); |
| CHDO | 1,4-cyclohexane diol, (available from Aldrich Chemical Company); |
| HDO | 1,6-hexanediol, (available from Aldrich Chemical Company); |
| BDO | 1,4-butanediol, (available from Aldrich Chemical Company); |
| EG | 1,2-ethanediol, (available from Matheson, Coleman & Bell); |
| TMP | trimethylol propane, (available from Aldrich Chemical Company). |

SAMPLE PREPARATION

Sample preparations for all examples were carried out under subdued lights, that is, at a light intensity below the level necessary to initiate polymerization. Solutions were stored in amber glass bottles.

CURE TIME EVALUATION PROCEDURE

Cure time evaluation using cationic organometallic salts and oxalate esters as photoinitiators for epoxy and epoxy-acrylate compositions were conducted in the following manner: Stock solutions were made containing 25 grams of Epon 828 epoxy and 0.125 gram of the organometallic salt and/or 0.125 gram of the oxalate ester and/or 2.5 gram of the diol. Epoxy-acrylate stock solutions were made containing 20 grams of Epon 828, 5 grams of acrylate, 0.005 gram of KB-1, 0.125 gram of the organometallic salt, $Cp(Xyl)Fe^+SbF_6^-$, and/or 0.125 gram of the oxalate ester, di-t-butyl oxalate and/or 2.5 grams diol.

Approximately 0.3 gram of each stock solution was placed in individual aluminum containers to evaluate for cure times. Light exposures were made using an appropriate light source and the sample was placed on a hot plate covered with a large aluminum plate to keep the temperature constant at 90° C. Cure time was determined by touching the sample with a stick and noting when the sample was no longer liquid. Three evaluations per sample were completed and the average time to cure tack-free was recorded.

CURED POLYMER PHYSICAL PROPERTY MEASUREMENT PROCEDURE

Epoxy stock solutions were made containing 25 grams of epoxy and 0.125 gram of the organometallic salt, $Cp(Xyl)Fe^+SbF_6^-$, and/or 0.125 gram of the oxalate ester, tBOX and/or 2.5 grams of diol. Epoxy-acrylate stock solutions were made containing 20 grams of Epon 828, 5 grams of acrylate, 0.005 gram of KB-1, 0.125 gram of the organometallic salt, $Cp(Xyl)Fe^+SbF_6^-$, and/or 0.125 gram of the oxalate ester, tBOX and/or 2.5 grams of diol.

Dogbone molds for sample curing were made by stamping a dogbone (ASTM D638 IV-89) out of a 7.5 cm by 15 cm silicone rubber sheet (#8702, 36"×36"×1/32", 70 darometer, made by the Groendyk Manufacturing Company, Buchanan, Va.). Samples were prepared for testing by pouring the solution into the dogbone mold situated between two sheets of transparent polyester release liner. Dogbones were irradiated with the appropriate light source, followed by heat curing in an oven for 30 minutes at 100° C. At least three dogbones were measured from each sample series and the average reported.

Physical property measurement of cured epoxy and epoxy-acrylate compositions was conducted according to ASTM D638-89, "Standard Test Method for Tensile Properties of Plastics" using an Instron, model #1122.

LIGHT EXPOSURE PROCEDURE

Quartz halogen lamp—A 500 watt tungsten halogen floodlight (#2V623 from Dayton Electrical Mfg. Co., Chicago, Ill.). Light exposures were made with the sample positioned 15 cm under the light. Exposure was timed using a Gralab Timer (model #300, Dimco-Gray Company, Centerville, Ohio).

BL-350 lamp—Two 15 Watt BL-350 fluorescent bulbs (#F15T8-BL, General Electric Corporation, New York, N.Y.) in a Blak-Ray Lamp fixture (model XX-15L, UVP, Inc., San Gabriel, Calif.). Light exposures were made with the sample positioned 8 cm under the light. Exposure was timed using a Gralab Timer (model #300, Dimco-Gray Company, Centerville, Ohio).

EXAMPLES 1–2 AND COMPARATIVE EXAMPLES C1–C3

Epoxy Cure Time Trials

These examples illustrate the use of the cationic organometallic salt photocatalyst, $Cp(Xyl)Fe^+SbF_6^-$, with an oxalate ester. This combination was more efficient than the cationic organometallic salt alone, while continuing to provide good thermal stability in the dark. Two different oxalate esters were tested, tBOX and bBOX. Cure time trials were done in Epon 828 epoxy, after two minutes irradiation with a quartz halogen lamp. Examples C2 and C3 do not contain the cationic organometallic complex salt.

TABLE 1

| EX # | Catalyst System in Epon 828 | Cure Time at 90° C. (seconds) |
|---|---|---|
| C1 | COM | 329 |
| 1 | COM:tBOX | 41 |
| 2 | COM:bBOX | 236 |
| C2 | tBOX | no cure after 8 hours |
| C3 | bBox | no cure after 8 hours |

Essentially no cure took place when these samples were heated in the dark for 4 hours at 100° C.

EXAMPLES 3–4 AND COMPARATIVE EXAMPLES C4–C7

Epoxy Cure Time Trials

These examples illustrate the use of the combination of the cationic organometallic salt with an oxalate ester and a diol. Many epoxies were too brittle to be used alone and were "flexibilized" or chain extended with diols and/or polyols. Addition of the diol, 1,4-cyclohexane dimethanol (CHDM), to the cationic organometallic salt resulted in increased cure times. In contrast, addition of the diol to the COM/oxalate ester catalyzed samples did not substantially affect cure times. Examples C6 and C7 did not contain the cationic organometallic complex salt.

TABLE 2

| EX # | Catalyst System in Epon 828 | Cure Time at 90° C. (seconds) |
|---|---|---|
| C4 | COM | 329 |
| C5 | COM:CHDM | 879 |
| 3 | COM:tBOX:CHDM | 38 |
| 4 | COM:bBOX:CHDM | 269 |
| C6 | tBOX:CHDM | no cure after 8 hours |
| C7 | bBOX:CHDM | no cure after 8 hours |

Essentially no cure took place when these samples were heated in the dark for four hours at 100 ° C.

EXAMPLES 5–9 AND COMPARATIVE EXAMPLES C8–C12

Epoxy Cure Time Trials

These examples illustrate that the $SbF_6^-$ salt of the cationic organometallic photocatalyst was reactive with the oxalate ester, di-t-butyl oxalate, for catalyzing Epon 828 epoxy polymerization. Cure time trials were done as described above, after two minutes irradiation with a quartz halogen lamp.

TABLE 3

| EX # | Catalyst System in Epon 828 | Cure Time at 90° C. (seconds) |
|---|---|---|
| C8 | CpXylFe$^+$SBF$_6^-$ | 329 |
| 5 | CpXylFe$^+$SbF$_6^-$:tBOX | 41 |
| C9 | CpMesFe$^+$SbF$_6^-$ | >10 minutes |
| 6 | CpMesFe$^+$SbF$_6^-$:tBOX | 94 |
| C10 | CpCumFe$^+$PF$_6^-$ | >10 minutes |
| 7 | CpCumFe$^+$PF$_6^-$:tBOX | >10 minutes |
| C11 | CpMesFe$^+$PF$_6^-$ | >10 minutes |
| 8 | CpMesFe$^+$PF$_6^-$:tBOX | >10 minutes |
| C12 | CpMesFe$^+$BF$_4^-$ | >10 minutes |
| 9 | CpMesFe$^+$BF$_4^-$:tBox | >10 minutes |

Essentially no cure took place when these samples were heated in the dark for four hours at 100° C.

EXAMPLES 10–13 AND COMPARATIVE EXAMPLES C13–C16

Epoxy Cure Time Trials

These examples illustrate that the $SbF_6^-$ salt of the cationic organometallic photocatalyst was reactive with the oxalate ester, di-t-butyl oxalate, for catalyzing ERL-4299 cycloaliphatic epoxy polymerization. Cure time trials were done as described above, after two minutes irradiation with a quartz halogen lamp.

TABLE 4

| EX # | Catalyst System in ERL 4299 | Cure Time at 90° C. (seconds) |
|---|---|---|
| C13 | Cp(Xyl)Fe$^+$SbF$_6^-$ | 59 |
| 10 | Cp(Xyl)Fe$^+$SbF$_6^-$:tBOX | 38 |
| C14 | Cp(Cum)Fe$^+$PF$_6^-$ | >10 minutes |
| 11 | Cp(Cum)Fe$^+$PF$_6^-$:tBOX | >10 minutes |
| C15 | Cp(Mes)Fe$^+$PF$_6^-$ | >10 minutes |
| 12 | Cp(Mes)Fe$^+$PF$_6^-$:tBOX | >10 minutes |
| C16 | Cp(Mes)Fe$^+$BF$_4^-$ | >10 minutes |
| 13 | Cp(Mes)Fe$^+$BF$_4^-$:tBOX | >10 minutes |

Essentially no cure took place when these samples were heated in the dark for four hours at 100° C.

EXAMPLES 14–19

Epoxy Cure Time Trials

These examples illustrate the use of various diols with the cationic organometallic photocatalyst, Cp(Xyl)Fe$^+$SbF$_6^-$, and the oxalate ester, tBOX, for catalyzing Epon 828 epoxy polymerization. Cure time trials were done as described above, after two minutes irradiation with a quartz halogen lamp.

TABLE 5

| EX # | Catalyst System in Epon 828 | Cure Time at 90° C. (seconds) |
|---|---|---|
| 14 | COM:tBOX:CHDM | 38 |
| 15 | COM:tBOX:CHDO | 107 |
| 16 | COM:tBOX:Ethylene Glycol | >10 minutes |
| 17 | COM:tBOX:HDO | >10 minutes |
| 18 | COM:tBOX:BDO | >10 minutes |
| 19 | COM:tBOX:TMP | >10 minutes |

Essentially no cure took place when these samples were heated in the dark for 4 hours at 100 ° C.

EXAMPLES 20–23 AND COMPARATIVE EXAMPLES C17–C20

Epoxy-Acrylate Cure Time Trials

These examples illustrate the use of the cationic organometallic salt photocatalyst, Cp(Xyl)Fe$^+$SbF$_6^-$, with tBOX, and a free radical photocatalyst, benzil dimethoxy ketal (KB-1), to polymerize an epoxy-acrylate composition. This combination was a more efficient photocatalyst system than the cationic organometallic salt alone, while continuing to provide good thermal stability in the dark. Samples were blanketed with a stream of nitrogen while irradiated for two minutes with a BL-350 low intensity UV lamp. After irradiation, cure time trials were done as described above.

TABLE 6

| EX # | Catalyst System in Epon 828 (80%) | Acrylate (20%) | Cure Time at 90° C. (seconds) |
|---|---|---|---|
| C17 | COM:KB-1 | THFA | 323 |
| 20 | COM:tBOX:KB-1 | THFA | 210 |
| C18 | COM:KB-1 | HDDA | Cured under light* |
| 21 | COM:tBOX:KB-1 | HDDA | Cured under light* |
| C19 | COM:KB-1 | TEGDA | Cured under light* |
| 22 | COM:tBOX:KB-1 | TEGDA | Cured under light* |
| C20 | COM:KB-1 | BDDA | Cured under light* |
| 23 | COM:tBOX:KB-1 | BDDA | Cured under light* |

*sample cured to a non-tacky state while being irradiated. Essentially no cure took place when these samples were heated in the dark for 4 hours at 100° C.

EXAMPLES 24–27 AND COMPARATIVE EXAMPLES C21–C24

Epoxy-Acrylate Cure Time Trials

These examples illustrate the use of the combination of the cationic organometallic salt with an oxalate ester, a diol, and a free radical photoinitiator, benzil dimethoxy ketal (KB-1 ). The epoxies were too brittle to be used alone and were "flexibilized" or chain extended with diols and/or polyols. Addition of the diol, 1,4-cyclohexane dimethanol (CHDM), to the cationic organometallic salt resulted in increased cure times. In contrast, addition of the diol to the COM/oxalate ester catalyzed samples did not substantially affect cure times. Samples were blanketed with a stream of nitrogen while irradiated for two minutes with a BL-350 low intensity UV lamp. After irradiation, cure time trials were done as described above.

TABLE 7

| EX # | Catalyst System in Epon 828 (80%) | Acrylate (20%) | Cure Time at 90° C. (seconds) |
|---|---|---|---|
| C21 | COM:CHDM:KB-1 | THFA | 402 |
| 24 | COM:tBOX:CHDM:KB-1 | THFA | 311 |
| C22 | COM:CHDM:KB-1 | TEGDA | Cured under light* |
| 25 | COM:tBOX:CHDM:KB-1 | TEDGA | Cured under light* |
| C23 | COM:CHDM:KB-1 | BDDA | Cured under light* |
| 26 | COM:tBOX:CHDM:KB-1 | BDDA | Cured under light* |
| C24 | COM:CHDM:KB-1 | HDDA | Cured under light* |
| 27 | COM:tBOX:CHDM:KB-1 | HDDA | Cured under light* |

*sample cured to a non-tacky state while being irradiated. Essentially no cure took place when these samples were heated in the dark for four hours at 100° C.

EXAMPLES 28-30 AND COMPARATIVE EXAMPLES C25-C27

Epoxy Physical Property Measurements

These examples illustrated the effect of combining the cationic organometallic photocatalyst with the oxalate ester on cured epoxy polymer physical properties. The polymer films that were more completely cured had higher tensile strength and modulus (stiffness).

TABLE 8

| EX # | Catalyst System | Epoxy | Tensile Strength (MPa) | Modulus (MPa) |
|---|---|---|---|---|
| C25 | COM | Epon 828 | 7.2 | 184.4 |
| 28 | COM:tBOX | Epon 828 | 48.8 | 866.6 |
| C26 | COM | ERL-4299 | 31.4 | 474.4 |
| 29 | COM:tBOX | ERL-4299 | 39.0 | 594.9 |
| C27 | COM | ERL-4221 | 16.3 | 796.9 |
| 30 | COM-tBOX | ERL-4221 | 29.8 | 842.4 |

Essentially no cure took place when these samples were heated in the dark for four hours at 100° C.

EXAMPLES 31-34 AND COMPARATIVE EXAMPLES C28-C31

Epoxy-Acrylate Physical Property Measurements

These examples illustrated the effect of combining the cationic organometallic photocatalyst with the oxalate ester on cured epoxy-acrylate polymer physical properties. The polymer films that were more completely cured have higher tensile strength and modulus (stiffness).

TABLE 9

| EX # | Catalyst System in Epon 828 (80%) | Acrylate (20%) | Tensile Strength (MPa) | Modulus (MPa) |
|---|---|---|---|---|
| C28 | COM:KB-1 | HDDA | 8.5 | 152.2 |
| 31 | COM:tBOX:KB-1 | HDDA | 21.4 | 384.5 |
| C29 | COM:KB-1 | THFA | 13.2 | 167.1 |
| 32 | COM:tBOX:KB-1 | THFA | 63.6 | 974.3 |
| C30 | COM:KB-1 | BDDA | 8.0 | 70.8 |
| 33 | COM:tBOX:KB-1 | BDDA | 27.7 | 612.4 |
| C31 | COM:KB-1 | TEGDA | 4.1 | 6.8 |
| 34 | COM:tBOX:KB-1 | TEGDA | 11.0 | 115.2 |

EXAMPLES 35-38 AND COMPARATIVE EXAMPLES C32-C35

Epoxy-Acrylate Physical Property Measurements

These examples illustrated the effect of combining the cationic organometallic salt with an oxalate ester, a diol, and a free radical photoinitiator, benzil dimethoxy ketal (KB-1) on cured epoxy-acrylate polymer physical properties. Addition of the diol to the COM/oxalate ester catalyzed samples increased cured tensile strength and modulus.

TABLE 10

| EX # | Catalyst System in Epon 828 (80%) | Acrylate (20%) | Tensile Strength (MPa) | Modulus (MPa) |
|---|---|---|---|---|
| C32 | COM:CHDM:KB-1 | HDDA | 13.3 | 297.8 |
| 35 | COM:tBOX:CHDM:KB-1 | HDDA | 20.7 | 381.6 |
| C33 | COM:CHDM:KB-1 | THFA | 0.2 | 0.5 |
| 36 | COM:tBOX:CHDM:KB-1 | THFA | 8.5 | 162.4 |
| C34 | COM:CHDM:KB-1 | BDDA | 11.7 | 358.2 |
| 37 | COM:tBOX:CHDM:KB-1 | BDDA | 26.4 | 543.9 |
| C35 | COM:CHDM:KB-1 | TEGDA | 0.7 | 1.0 |
| 38 | COM:tBOX:CHDM:KB-1 | TEGDA | 6.8 | 83.1 |

EXAMPLES 39-40 AND COMPARATIVE EXAMPLES C36-C37

A Semi-Structural, Thermosettable PSA

This example illustrated the effectiveness of the COM/tBOX photocatalyst system in making a pressure senstive adhesive that can be heat cured to higher bond strengths.

A coatable acrylate syrup was made which contained 60 parts by weight of BA and 40 parts by weight of THFA. 0.04 part by weight of KB-1 photoinitiator was added to the acrylate mixture, the mixture was de-aerated with bubbling nitrogen, and the acrylate monomers were taken to approximately 10% polymerization conversion by irradiation with BL-350 low intensity UV lamps. 60 parts by weight of this syrup was admixed with 40 parts by weight of the epoxy mixture that consisted of 80 parts by weight of Epon 828 and 20 parts by weight of Epon 1001F. 0.6 part of KB-1 and 0.4 part by weight of $Cp(Xyl)Fe^+SbF_6^-$, 0.4 part by weight of tBOX and 4 parts by weight of melted CHDM were added to the syrup/epoxy solution. This solution was stored in the dark until used. Prior to coating, it was de-aerated in a vacuum chamber, then knife coated at 30 mils thickness between transparent release liners and irradiated with BL-350 low intensity UV lights at a light dosage of 1960 mJ·cm$^{-2}$. This film was a clear, rubbery, self-supporting pressure sensitive adhesive.

Samples of these adhesives were used to bond 10 cm×1.2 cm steel panel which had been zinc phosphated, primed and electro-coated with General Motors ED11 paint (Type APR16235, from Advance Coating Technologies, Inc., Hillsdale, Mich.). Prior to bonding, the panels were wiped clean with isopropanol. An overlap joint approximately 1.2 cm in length was formed and the bonded strips were placed in an air circulating oven at 100° C. for 30 minutes. The overlap shear bond strength was measured by pulling the bonds using an Instron Tensile Tester, model #4204. The jaw separation rate was 5 cm·min$^{-1}$.

TABLE 11

| EX # | Catalyst System | Overlap Shear Bond Strength (psi) | Bond Failure Mode |
|---|---|---|---|
| C36 | COM | 510 | Adhesive |
| C37 | COM:CHDM | 536 | Adhesive |
| 39 | COM:tBOX | 2037 | Paint Failure |
| 40 | COM:tBOX:CHDM | 2169 | Paint Failure |

Adhesive bond failure means that the bond failed at the paint-adhesive interface. Paint failure means that the adhesive pulled the paint off the steel substrate, and that bond failure occured at the zinc phosphate-steel interface.

EXAMPLE 41

A One-Part Epoxy Structural Adhesive

This example illustrates the use of the COM/tBOX photocatalyst system in a one-part photo-activated epoxy structural adhesive. 47.4 parts by weight of Epon 828, 7.1 parts by weight of BTA IIIF and 4.7 parts by weight of WC-68 were admixed and agitated under moderate shear at 125° C. for one hour. Mixing was completed when the absence of gel particles was observed. This solution was cooled to 100° C. and 1.0 part by weight of the catalyst, Cp(Xyl)Fe+SbF$_6$− and 0.1 part by weight of bBOX, were added with continuous mixing for 30 minutes or until completely dissolved. After cooling to room temperature, 8.82 parts by weight of 1,4-butane diol was added and uniformly mixed. To this mixture was added, 20.44 parts by weight of GP71 amorphous silica, 4.09 parts by weight of B37/2000 glass bubbles and 1.64 parts by weight of TS720 fumed silica. This adhesive was knife coated at 20 mil thickness onto a polyester film. The coated polyester film was placed under a fluorescent lamp of the "Super Diazo Blue" type (available from Sterling Electric, Plymouth, Minn.). The distance between the lamp and the coating was 5 cm and exposure time was 3 minutes. After exposure the adhesive was removed from the polyester film. Bonds were made using 1.6 mm cold-rolled steel as specified in ASTM Standard A619 and converted to 2.5 cm × 10 cm strips from larger sheet stock. Prior to applying the adhesive, the steel was degreased in acetone and then an automotive draw oil ARMA ™ 524 (Mobil Oil Corporation) was brushed onto the surface. After 10 minutes, excess oil was removed by wiping twice with clean cheesecloth. Stainless steel spacer wire, 0.15 mm in diameter, was used to control bondline thickness. Adhesive was applied over both coupons, then 1.5 cm lengths of spacer wire were uniformly centered 0.75 cm apart across the width of one coupon. The coupons were brought together and clamped along each overlapped side with paper binder clips. The clips remained in place until the adhesive was fully cured in a forced air oven at 170° C. for 30 minutes. Bonds were allowed to equilibrate at room temperature for a minimum of two hours prior to determining shear strength. Shear strength was determined using ASTM Test Method D1002-72 (1983) on an Instron tensile testing machine (Model #4240) at a crosshead speed of 5 cm per minute. Four bonds were made and tested. The average bond strength of this adhesive was 2165 psi and the failure mode was cohesive.

EXAMPLE 42

An Epoxy-Acrylate Coating on Aluminum

An epoxy-acrylate solution for aluminum coating was prepared in the following manner: 70 parts by weight of Epon 828 epoxy was mixed with 18 parts by weight of HDDA and 12 parts by weight of THFA. To this mixture was added 0.5 part by weight of COM, KB-1 and tBOX. A comparative solution was prepared in a similar manner, except tBOX was not added. These solutions were allowed to stand at room temperature with occasional shaking until all components were miscible. The solutions were knife-coated at a thickness of 1.5 mils on aluminum panels that had been wiped twice with MEK. Three coatings of each solution were made. The coatings were UV cured using an RPC processor (model QC1202 ANIR), 2 lamps on the normal setting, 2 passes, 50 feet per minute, in air. After UV processing, the coatings were heat cured in an oven with a temperature set at 100° C. for 30 minutes. Pencil hardness was measured using ASTM Test Method D-3363-74 (1989). Cross Hatch Adhesion was measured using ASTM Test Method D-3359-90. Gloss measurements were made using a Micro Tri Gloss glossometer (available from BYK Gardner, Inc. Silver Springs, Md.). Higher values indicate superior performance.

TABLE 12

| Sample | Pencil Hardness | Cross Hatch Adhesion | 20 Degree Gloss |
|---|---|---|---|
| with tBOX | 4H | 4.7 | 104.2 |
| no tBOX | 3H | 3.3 | 100.2 |

EXAMPLE 43 AND COMPARATIVE EXAMPLE C38

This example illustrated the effect of combining the cationic organometallic catalyst, tBOX and a peroxide, Trigonox 29 (trig29), on epoxy film properties. 0.125 part each of COM and/or tBOX were dissolved in 25 parts Epon 828, then 0.125 part of Trigonox 29 was added. The samples were irradiated with a BL-350 for five minutes, then cured for 30 minutes at 100° C. The results are summarized the Table 13.

EXAMPLE 44 AND COMPARATIVE EXAMPLE C39

This example illustrated the effect of combining the cationic organometallic catalyst, tBOX and a peroxide, Trigonox 29, on epoxy-acrylate film properties. 20 parts of Epon 828 was mixed with 5 parts of THFA. 0.125 part each of the catalysts were added and shaken occasionally until in solution. The samples were irradiated with a BL-350 UV light for five minutes, then cured for 72 hours at 100° C. The results are summarized in Table 13

TABLE 13

| EX # | Catalyst System | Tensile Strength (MPa) | Modulus (MPa) |
|---|---|---|---|
| C38 | COM:Trig29 | 25.0 | 532.8 |
| 43 | COM:tBOX:Trig29 | 43.2 | 810.8 |
| C39 | COM:Trig29 | 43.7 | 686.1 |
| 44 | COM:tBOX:Trig29 | 51.5 | 720.8 |

EXAMPLE 45

An epoxy-acrylate solution was prepared in the following manner: 8 parts of THFA was mixed with 2.0 parts of IBA. To this solution was added 10.0 parts of molten DEN 439. The temperature of the solution was approximately 80° C. The solution was then placed on a shaker tabel overnight or until miscible. To the miscible solution was added 0.05 part each of COM, tBOX, and KB-1. 0.21 part of CHDM was then added, and the mixture was stirred on a magnetic stirrer in the dark. This solution was knife-coated between two polypropylene films at a nominal 1 mil thickness. The film was photolyzed between two 8 Watt 360 nm ultraviolet lights for 8 minutes. The resultant film was tacky and had good adhesive properties.

The 1 mm thick soda-line glass test substrate had indium-tin oxide (ITO) circuit traces having a sheet resistance of 20 ohm/cm$^2$ and a thickness of about 1000

Angstroms. The circuit traces are configured to permit 4 probe resistance measurement of individual pad pairs as well as the total perimeter or daisy chain value. The semiconductor test chips are 6.73 mm$^2$ by 0.50 mm thick. They have a pad count of 120 and a pitch of 200 micrometers; each pad is 100 micrometers$^2$. All pads are joined in pairs to permit daisy chain measurements. The aluminum straps that connect the pad pairs have resistances of approximately 500 milli-ohm. Resistance measurements are of pad pairs including the aluminum strap. The sample test fixture consisted of a "bed of nails" fixture with pressure engaged "pogo" probes, where the probes are staggered to allow each circuit trace to be contacted and measured in pairs sequentially around the substrate.

A square of the adhesive was pressed onto the surface of a glass having ITO circuit traces. A semiconductor chip was brought into contact with the adhesive and a pressure of 100 psi was applied. At that point, the temperature was raised rapidly until the temperature of the heater reached 160° C., then held there for about 20 seconds. The heater was then turned off and the bond was cooled under pressure until the heater temperature read approximately 60° C. The substrate was then removed from the chip bonder and the number of open contacts and the resistance per side was measured. Resistance of the circuit traces are summarized in Table 14.

EXAMPLE 46

An epoxy-acrylate solution was prepared according to Example 45 except DEN 439 was replaced with 5.0 parts of Quatrex2 and 5.0 parts of Quatrex1. CHDM was added in the amount of 0.97 part. Resistance of the circuit traces are summarized in Table 14.

EXAMPLE 47

An epoxy-acrylate solution was prepared according to Example 45 except 0.2 part of coupling agent 3GPMS (available from Petrarch Chemical Co.) was added. Resistance of the circuit traces are summarized in Table 14.

EXAMPLE 48

An epoxy-acrylate solution was prepared according to Example 45 except DEN 439 was replaced with 5.0 parts of Quatrex2 and 5.0 parts of Quatrex1. CHDM was added in the amount of 0.97 part. THFA was added in the amount of 10.0 parts. Resistance of the circuit traces are summarized in Table 14.

TABLE 14

| Example | Average Resistance (ohms) | | No. of Open Contacts Per Side* |
|---|---|---|---|
| 45 | side 1: | 4.43 | 2 |
|  | side 2: | 14.84 | 2 |
|  | side 3: | 15.71 | 3 |
|  | side 4: | 6.36 | 3 |
| 46 | side 1: | 5.81 | 3 |
|  | side 2: | 27.89 | 11 |
|  | side 3: | 8.76 | 2 |
|  | side 4: | 0.89 | 7 |
| 47 | side 1: | 10.20 | 2 |
|  | side 2: | 6.48 | 1 |
|  | side 3: | 2.08 | 2 |
|  | side 4: | 7.41 | 0 |
| 48 | side 1: | 7.01 | 5 |
|  | side 2: | 6.05 | 6 |
|  | side 3: | 12.71 | 6 |

TABLE 14-continued

| Example | Average Resistance (ohms) | | No. of Open Contacts Per Side* |
|---|---|---|---|
|  | side 4: | 7.83 | 5 |

*total contacts per side is 16. Low resistance values and low number of open contacts indicate good performance.

Various modifications and alterations of this invention will become apparent to those skilled in the art without departing from the scope and spirit of this invention, and it should be understood that this invention is not to be unduly limited to the illustrative embodiments set forth hereinabove.

We claim:

1. A cationically polymerizable composition comprising:
   (1) at least one cationically polymerizable monomer;
   (2) a catalyst system comprising:
      (a) at least one organometallic complex salt,
      (b) a thermally decomposable ester reaction product of a tertiary alkyl alcohol and an acid that forms a chelation complex with the metal ion of the organometallic complex salt, and
      (c) optionally, peroxide;
   (3) optionally, a buffer compound; and
   (4) optionally, a mono- or polyfunctional alcohol.

2. The cationically polymerizable composition according to claim 1, further comprising:
   (1) 1–99 wt % of at least one cationically polymerizable monomer;
   (2) 0.01–20 wt % of a catalyst system comprising:
      (a) 0.01–19.99 wt % of at least one organometallic complex salt,
      (b) 0.01–19.99 wt % of a thermally decomposable ester reaction product of a tertiary alkyl alcohol and an acid that forms a chelation complex with the metal ion of the organometallic complex salt, and
      (c) 0 to 20 wt % of a peroxide;
   (3) 0 to 20 wt % of a buffer compound; and
   (4) 0 to 50 wt % of a mono- or polyfunctional alcohol.

3. The cationically polymerizable composition according to claim 2, further comprising 0 to 98 wt % of adjuvants or thermoplastic polymers.

4. The cationically polymerizable compound according to claim 2, wherein the cationically polymerizable monomer is selected from the group consisting of epoxies, cyclic ethers, vinyl ethers, siloxanes, N-vinyl compounds, alpha-olefins, lactams, and lactones.

5. The cationically polymerizable compound according to claim 4, wherein the organometallic complex salt is selected from the group consisting of (eta$^6$-xylenes(mixed isomers))(eta$^5$-cyclopentadienyl) iron (1+) hexafluoroantinomate, (eta$^6$-xylenes(mixed isomers))(eta$^5$-cyclopentadienyl) iron (1+) hexafluorophosphate, (eta$^6$-m-xylene)(eta$^5$-cyclopentadienyl)iron(1+) tetrafluoroborate, (eta$^6$-o-xylene)(eta$^5$-cyclopentadienyl)iron(1+) hexafluoroantimonate, (eta$^6$-p-xylenes)(eta$^5$-cyclopentadienyl)iron(1+) triflate, (eta$^6$-toluene)(eta$^5$-cyclopentadienyl)iron(1+) hexafluoroantimonate, (eta$^6$-cumene)(eta$^5$-cyclopentadienyl)iron(1+) hexafluoroantimonate, (eta⁶-p-xylene)(eta⁵-cyclopentadienyl)iron(1+) hexafluoroantimonate, (eta⁶-m-xylene)(eta⁵-cyclopentadienyl)iron(1+) hexafluoroantimonate, (eta⁶-hexamethylbenzene)(eta⁵-cyclopentadienyl)iron(1+) hexafluoroantimonate, (eta⁶-naphthalene)(eta⁵-cyclopentadienyl)iron(1+) hexafluoroantimonate, (eta⁶-pyrene)(eta⁵-cyclopentadienyl)iron(1+) hexafluoroantimonate, (eta⁶-chrysene)(eta⁵-cyclopentadienyl)iron(1+) hexafluoroantimonate, (eta⁶-mesitylene)(eta⁵-cyclopentadienyl)iron(1+) hexafluoroantimonate, (eta⁶-cumene)(eta⁵-cyclopentadienyl)iron(1+) hexafluorophosphate, (eta⁶-mesitylene)(eta⁵-cyclopentadienyl)iron(1+) pentafluorohydroxyantimonate, and (eta⁶-toluene)(eta⁵-cyclopentadienyl)iron(1+) hexafluoroarsenate.

6. The cationically polymerizable compound according to claim 5, wherein the thermally decomposable ester reaction product of a tertiary alcohol and an acid is selected from the group consisting of oxalic, phosphorous, and phosphoric acid.

7. The cationically polymerizable confound according to claim 6 further comprising 0–20 wt % of peroxide.

8. The cationically polymerizable compound according to claim 7 further comprising 0–50 wt % of a mono- or polyfunctional alcohol.

* * * * *

UNITED STATES PATENT AND TRADEMARK OFFICE
CERTIFICATE OF CORRECTION

PATENT NO.: 5,399,637

DATED: Mar. 21, 1995

INVENTOR(S): Willett et al.

It is certified that error appears in the above-identified patent and that said Letters Patent is hereby corrected as shown below:

Col. 3, line 46, Delete the period before "complex"

Col. 10, line 44, Delete "avenge" and insert --average--

Col. 12, line 10, Delete "mount" and insert --amount--

Col. 15, line 3, Delete "cation, ally" and insert --cationically--

Col. 16, line 68, Delete "mount" and insert --amount--

Col. 17, line 22, Delete "press" and insert --process--

Col. 18, line 13, Delete "carded" and insert --carried--

Col. 19, line 62, Delete "0,005" and insert --0.005--

Col. 21, Table 4, In Ex # C16, Delete "Cp(Mes)Fe $^-$BF$_4^-$" and insert --Cp(Mes)Fe$^+$BF$_4^-$--

Col. 30, line 10, Delete "confound" and insert --compound--

Signed and Sealed this

Twenty-first Day of November, 1995

Attest:

BRUCE LEHMAN

Attesting Officer

Commissioner of Patents and Trademarks